United States Patent [19]

Lippmaa et al.

[11] 4,254,373
[45] Mar. 3, 1981

[54] SENSOR FOR GENERATING NUCLEAR MAGNETIC RESONANCE SIGNALS

[76] Inventors: Endel T. Lippmaa, ulitsa Sybra, 14, kv. 2; Madis A. Alla, ulitsa Trummi, 23a, kv. 25, both of Tallin; Ants A. Salumyae, ulitsa Pykhya, 18, kv. 24, Keila; Tiit A. Tukherm, Ed. Vilde tee, 143, kv. 21, Tallin, all of U.S.S.R.

[21] Appl. No.: 890,252

[22] Filed: Mar. 27, 1978

[30] Foreign Application Priority Data

Jun. 3, 1977 [SU] U.S.S.R. .............................. 2491999

[51] Int. Cl.³ .......................................... G01R 33/08
[52] U.S. Cl. ................................................ 324/321
[58] Field of Search .......... 324/0.5 R, 0.5 A, 0.5 AH

[56] References Cited

U.S. PATENT DOCUMENTS

| | | | |
|---|---|---|---|
| 2,960,649 | 11/1960 | Bloch | 324/0.5 R |
| 3,091,732 | 5/1963 | Anderson et al. | 324/0.5 AH |
| 3,462,677 | 8/1969 | Paitich | 324/0.5 AH |
| 3,512,078 | 5/1970 | Hall | 324/0.5 AH |
| 3,588,677 | 6/1971 | Kleiman | 324/0.5 AH |
| 3,911,355 | 10/1975 | Leane | 324/0.5 A |
| 4,088,944 | 5/1978 | Engler | 324/0.5 AH |

*Primary Examiner*—Michael J. Tokar
*Attorney, Agent, or Firm*—Lackenbach, Lilling & Siegel

[57] ABSTRACT

A sensor for generating nuclear magnetic resonance signals comprises a radio-frequency NMR coil wound around a frame accommodating a rotor with a test sample. The rotor is rotatably mounted in a gas bearing which is formed by the surface of revolution of the rotor, the internal surface of the frame and a gap between the above-mentioned surfaces. The compressed gas is delivered to the gap so as to produce the gas pillow of the gas bearing and to provide thermostatic control of the test sample. The rotor is provided with a rotation means.

22 Claims, 3 Drawing Figures

SENSOR FOR GENERATING NUCLEAR MAGNETIC RESONANCE SIGNALS

FIELD OF THE INVENTION

The invention relates to nuclear magnetic resonance (NMR) radiospectrometry and more particularly, to sensors that generate NMR signals (hereinafter referred to as NMR sensors).

The invention is suitable for high-resolution NMR spectrometers that investigate solid bodies. In particular, applications that are concerned with physical/-chemical investigation of the structure of organic compounds and polymers.

DESCRIPTION OF THE PRIOR ART

In order to obtain high resolution NMR spectra of solid bodies for nuclei are heavier than that of hydrogen ($^{13}C$, $^{29}Si$ and others), it is necessary that a nonmetallic rotor with a test sample be rotated at a high speed, i.e., at a rotational speed of up to 4–5 kHz, about an axis that is positioned at a magic angle $\psi$, about 54°44', to the direction of a steady magnetic field.

Known in the art are NMR sensors comprised of a radio-frequency NMR coil whose frame accommodates a rotor with a test sample, which is arranged coaxially with respect to the frame.

The rotor rotates about a flexible axle that passes through a central bore hole in it and is rigidly fixed in the immovable portion of the sensor. The rotor rotates by virtue of compressed gas delivered through glass jet nozzles to the peripheral ribs on the rotor surface.

The described sensors feature low sensitivity, since the test sample encompasses only a partial volume of the radio-frequency NMR coil. Moreover, extremely low stability and short service life (several hours only) are due to the fact that a great friction load occurs in the rotation subassembly.

A higher sensitivity is intrinsic to an NMR sensor in which a rotor with a test sample is rotatably mounted in a gas bearing positioned outside a radio-frequency NMR coil. The movable member of the gas bearing has a conical shape and has mounted on its surface the blades of a small gas turbine which allow rotation of the rotor (cf. an article by E. R. Andrew in "Progress in Nuclear Magnetic Resonance Spectroscopy", vol. 8, ed. by I. W. Emsley, I. Feeney, L. H. Sutcliffe, Pergamon Press, 1972, pp. 24–27). The movable member of the gas bearing rotates in a cone-shaped recess of the immovable member (stator) of the bearing. A preset variable gap between the movable and the immovable member of the gas bearing is provided by the turbine in which very complex aerodynamic processes take place which are responsible for the position of the movable member.

In the described sensor, the turbine is of a sophisticated design and is therefore generally made of a plastic (polyformaldehyde Delrin) with the result that an unwanted line appears in the $^{13}C$ NMR spectrum. In addition, the replacement of the test sample is difficult in this apparatus.

Note that a good stability of rotation of the rotor of this sensor is attained only when its axis of revolution is vertical. The stability of rotation is impaired considerably when the axis of revolution is inclined. As stated above, however, it is required that the axis of revolution of the rotor be positioned at a magic angle to the inducation vector of the magnetic field. The necessity of using a magnetic field having its induction vector directed at 54°44' to a vertical axis of the sensor leads to a much more sophisticated magnetic system and makes the use of superconducting magnets difficult.

Also note that the sensitivity of the described sensor is not sufficient, since the sample encompasses only a small portion of the complete width of the magnet gap, while the remaining portion of that gap is used ineffectively to accommodate the gas bearing subassembly.

SUMMARY OF THE INVENTION

An object of the invention is to provide for an increased sensitivity of a high resolution NMR sensor used for investigation of solid bodies.

Another object of the invention is to provide for a stable rotation of the rotor of the NMR sensor.

Still another object of the invention is to provide easy access to the test sample during its replacement.

Another object of the invention is to provide for a simple design of the NMR sensor so that its rotation subassembly is made of materials that would not introduce additional lines in NMR spectra, which could interfere with them.

With these and other objects in view, there is proposed a sensor for generating nuclear magnetic resonance signals comprising a radio-frequency NMR coil wound around a frame accommodating a rotor arranged coaxially therewith, the rotor being adapted to accommodate a test sample, being provided with a rotation means and being rotatably mounted in a gas bearing. The gas bearing, according to the invention, is defined by the surface of revolution of the rotor and the internal surface of the frame of the radio-frequency NMR coil, the compressed gas being delivered into a gap between the above-mentioned surfaces so as to produce a gas pillow of the gas bearing.

Preferably, the frame of the radio-frequency NMR coil is cylindrical, the rotor is a hollow cylinder having a detachable cone lid on at least one of its end. The external surface of the detachable cone lid is used to support the rotation means provided by shaped recesses serving as the blades of a small radial turbine. There are passages in the frame which deliver the gas stream into the gap between the rotor and the frame and to the blades of the small radial turbine.

Preferably, the compressed gas delivered into the gap is maintained at the temperature required for thermostatic control of the test sample.

The proposed NMR sensor makes it possible to considerably increase the useful volume of the test sample, since the complete width of the gap of an iron magnet or the central hole of a superconducting magnet and the volumne of the radio-frequency NMR coil are utilized more effectively. This results in an increase in both the sensitivity and resolution of the NMR spectrometer used. The constant width of the gap in the gas bearing provides for a stable position and rotation of the sensor rotor. The rotor with the test sample is easy to remove and replace. The rotor can be made of inorganic materials such as ceramics, glass, quartz and others. Such a rotor can be used for measuring high resolution NMR spectra obtained from compacted, powder and suspended solid bodies.

DESCRIPTION OF THE DRAWINGS

Other features and advantages of the invention will appear from the following description of a preferred embodiment thereof in conjunction with the accompanying drawings in which.

DESCRIPTION OF THE INVENTION

The NMR sensor of the invention comprises a radio-frequency NMR coil (FIG. 1) wound on a frame 2 made of a non-magnetic material, for example, ceramics, glass or quartz, featuring a small coefficient of thermal expansion.

Figure 1:
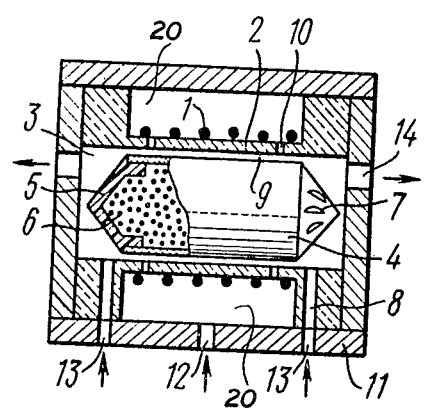
FIG. 1 is a longitudinal sectional view of an NMR sensor, according to the invention.

The frame 2 has a central thorough hole 3 which is cylindrical in the preferred embodiment. A rotor 4, which is a hollow cylinder, is coaxially arranged within the hole 3 therewith. On at least one end of the rotor 4 mounts a detachable lid 5 made, for example, of teflon is mounted. FIG. 1 illustrates the rotor 4 being provided with two lids 5 on its respective ends. The lids 5 are cone-shaped, but cylindrical lids 5 are also possible. A test sample 6, for example, an organic compound having the nuclei of $^{13}C$, is introduced into the internal cavity of the rotor 4.

In the given embodiment, a rotation means for the rotor is implemented on the external surfaces of the lids 5 in the form of shaped recesses 7 (cut, for example, by milling), these shaped recesses 7 being used as the blades of small radial turbines. Tangential passages 8 are provided in the frame 2 opposite the recesses 7, to direct the gas stream toward the turbine blades.

A gap 9 is formed between the external cylindrical surface (the surface of revolution) of the rotor 4 and the cylindrical surface of the hole 3 (the internal surface of the frame 2). Compressed gas is delivered into the gap 9 through passages 10 to create the gas pillow of a gas bearing provided by the above-mentioned cylindrical surfaces. The compressed gas is maintained at the temperature required for thermostatic control of the test sample 6, i.e., within a range of $-150°$ to $+200°$ C.

A housing 11 made of nonmagnetic material accommodates the frame 2 with the coil 1 and rotor 4. The housing 11 has vents 12 and 13 which connect, together with the passages 8 and 10, the internal cavity 20 of the frame 2 to the compressed gas source (not shown in the drawings). Also, the housing 11 has vents 14 through which the internal cavity of the frame 2 is connected with an outer space.

Figure 2:
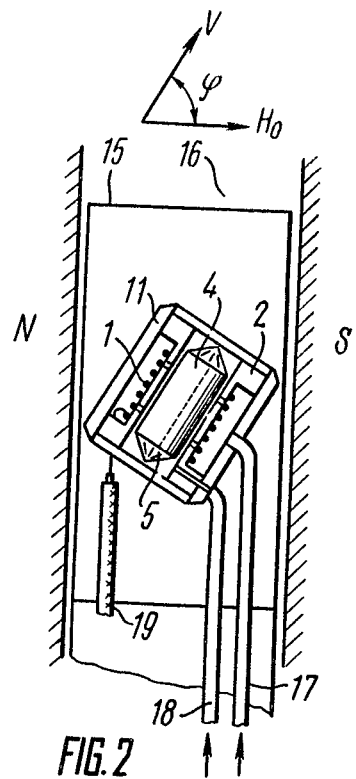
FIG. 2 is a diagrammatic top view of the NMR sensor of FIG. 1, according to the invention.

FIG. 2 shows the NMR sensor attached to a screen probe 15 which sits in the gap 16 of an electromagnet illustrated diagrammatically by its poles N and S. The sensor is so fixed in the screened probe 15 that the axis of revolution of the rotor 4 is directed at an angle $\psi$, about to $54°44'$, to the induction vector $H_o$ of the steady magnetic field. Arrows V and $H_o$ are used to indicate, respectively, the direction of the axis of revolution of the rotor 4 and that of the induction vector $H_o$ (see the top of FIG. 2).

Though FIG. 2 illustrates the NMR sensor in the gap of a conventional electromagnet, it is possible to use that sensor in conjunction with a superconducting magnet. It is necessary in such a case that the shape of the screened probe 15 correspond to the central hole of the superconducting magnet.

In the given embodiment, the radio-frequency NMR coil is comprised of two windings having their turns at right angles to each other. The embodiment illustrated in FIG. 3 uses the NMR sensor of the invention with two such windings 1' and 1", the winding 1' being used as an excitation field winding and the winding 1" being used as a sensing winding.

The NMR sensor, according to the invention, operates as follows.

The sensor with a test sample, attached to the screened probe 15 (FIG. 2), is set in the gap 16 of the electromagnet N-S.

The compressed gas from a gas source (not shown in the drawings), after it has been subject to appropriate thermostatic control, is passed through the conduit 17 to the gap 9 of the gas bearing to create a gas pillow. Another stream of compressed gas passes through the conduit 18 to the blades (recesses 7) of the turbines and this causes the rotor 4 to rotate rapidly and steadily. The rotational speed of the rotor 4 is controlled by changing the pressure of the gas delivered to the turbines through the conduit 18. A variable frequency generator (not shown in the drawings) produces a radio-frequency voltage (continuous-wave or pulsed) which is applied to the radio-frequency NMR coil 1. This results in a variable magnetic field that acts on the test sample. When the generator frequency is brought into coincidence with the Larmor precession frequency of the nuclei under investigation, the radio-frequency NMR coil 1 generates an NMR signal which is transferred to receiving equipment (not shown in the drawings) through a coaxil cable 19.

Figure 3:
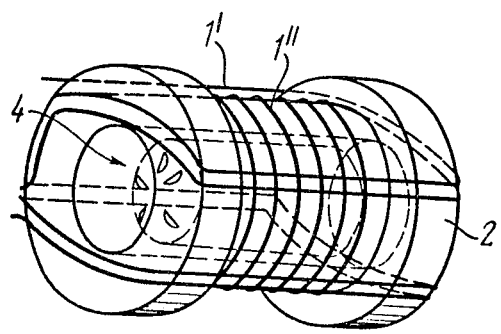
FIG. 3 is an isometric view of the NMR sensor with a radio-frequency NMR coil having two windings, according to the invention.

The embodiment of FIG. 3 provides for better extraction of the NMR signal induced in the winding 1" from the radio-frequency voltage applied to the winding 1'.

To replace the test sample, proceed as follows: withdraw the screened probe 15 with the sensor from the gap 16; withdraw the rotor 4 from the central hole 3 of the frame 2; take off one of the lids 5; and replace the test sample with a new one.

Test results show that the sensor rotor rotates steadily at a rotational speed of up to 5 kHz (at temperatures ranging from $-150°$ to $+200°$ C.) and its axis of revolution can acquire in this case any orientation desirable. This allows for the use of the proposed NMR sensor in conjunction with NMR spectrometers that employ very diverse magnets, including superconductive magnets. The rotor can rotate steadily for long periods so that its rotational speed is changed by not more than 1% per hour. This feature tends to broaden the capabilities of the NMR method of investigation of solid bodies, since NMR signals can be accumulated for long periods and radio-frequency pulses can be modulated in synchronism with the frequency of the rotor rotation.

As compared to a conventional NMR sensor with a gas bearing, the NMR sensor of the invention features at least a three-fold increase in sensitivity with the result that the measurement time is decreased approximately tenfold.

Used in conjunction with high-resolution NMR spectormeters, the proposed NMR sensor is suitable for investigation of molecular structure and microdynamic properties of solid bodies such as polymers, plastics and other organic compounds. This can be done in laboratories and under industrial conditions as well (for example, production control of polymeric materials in chemical industry).

What is claimed is:

1. A sensor of increased sensitivity and resolution for generating nuclear magnetic resonance signals for use in high resolution NMR spectrometry of solids, comprising:
   - a non-magnetic frame having a central hole and adapted to be disposed between the poles of an electromagnet;
   - a radio-frequency NMR coil wound around said frame;
   - a hollow, substantially symmetrical and rotatably stable, rotor having a rotation axis adapted to contain a test sample, arranged coaxially within the confines of said central hole and inside said coil, and said hollow rotor having drive means for rapid rotation, said drive means being of a gas stream; the rotational axis of said rotor being capable of orientation at any angle, within a range of 0° to about 54°44" relative to an induction vector within a flux plane of the magnetic field of said electromagnet;
   - a substantially uniform gap being defined by an inner surface of said frame and an external surface of said rotor, and
   - a generally tubular shape gas-bearing pillow adapted to be formed in said gap between said inner surface of said frame and said external surface of said rotor by compressed gas delivered into said gap.

2. A sensor as claimed in claim 1 wherein:
   said central hole of said frame is cylindrical;
   said rotor is a hollow cylinder; and
   said rotation means comprises:
   a detachable lid on at least one end of said rotor;
   shaped recesses on the external surface of said lid forming blades of a small radial turbine;
   said frame having a first set of passages to deliver said gas stream to said blades of said small radial turbine,
   a second set of passages in said frame to deliver the compressed gas into said gap; and a compressed gas source connected to said passages of said first set and said second set of passages.

3. A sensor as claimed in claim 2, wherein the compressed gas is maintained at a temperature required for thermostatic control of the test sample.

4. A sensor as claimed in claim 2, wherein the lid is in the shape of a cone.

5. A sensor as claimed in claim 2, wherein the lid is cylindrical.

6. A sensor as claimed in claim 5, wherein said angle is 54°44'.

7. A sensor as claimed in claim 1, wherein said rotor is relatively short so as to enable a tilted orientation axis of said rotor in said frame and enable the formation of a generally compact sensor assembly.

8. A sensor as claimed in claim 1, wherein said radio-frequency NMR coil is disposed within an internal cavity or recess in said frame, and said compressed gas passes through said cavity prior to entering said gap in said sensor.

9. A sensor as claimed in claim 2, wherein said second set of passages in said frame direct said compressed gas to said gap in said sensor; said radio-frequency coil being disposed in an internal cavity or recess in said frame, and the compressed gas entering said internal cavity or recess cools said radio-frequency coil prior to entering said second set of passages.

10. A sensor as claimed in claim 1, wherein said compressed gas is temperature controlled within a range from about −150° to +200° C.

11. A sensor as claimed in claim 7, wherein said radio-frequency coil comprises a plurality of windings having their turns at right angles to each other, and one of said windings serving as a sensing winding and another of said windings serving as an excitation winding.

12. A sensor as claimed in claim 1, wherein the rotational speed of said rotor is controlled by varying the pressure of said gas stream.

13. A sensor as claimed in claim 1, wherein said rotor is formed of an inorganic or carbon-free material.

14. A sensor as claimed in claim 13, wherein said material is selected from the group comprising ceramic, glass, quartz and any other like materials which do not introduce additional lines in NMR spectra.

15. A sensor as claimed in claim 11, wherein the coil has two windings with their turns at right angles to each other.

16. A sensor as claimed in claim 2, wherein both ends of said rotor are provided with shaped recesses forming small radial turbine blades.

17. A sensor as claimed in claim 2, including a housing, surrounding said frame and said rotor, having passageways for communication with said first and second sets of passages and having vents communicating with said central hole in said frame for venting said gas therefrom.

18. A sensor as claimed in claim 2, including detachable lids or plugs for closing both ends of said hollow rotor which also serve simultaneously as said rotation means for said rotor.

19. A sensor as claimed in claim 1, wherein said frame is attached to a screened probe set in said gap of said electromagnet.

20. A sensor as claimed in claim 1, wherein said compressed gas creates said gas pillow in said gap, and said gas stream, causing said rotor to rotate, constitutes another stream of compressed gas.

21. A sensor as claimed in claim 1, wherein said frame is disclosed in the central hole of a superconducting magnet.

* * * * *